(12) United States Patent
Azadeh

(10) Patent No.: US 8,929,746 B2
(45) Date of Patent: Jan. 6, 2015

(54) DIFFERENTIAL DRIVER, CIRCUITS AND DEVICES INCLUDING THE SAME, AND METHOD(S) OF MANUFACTURING THE SAME

(75) Inventor: Mohammad Azadeh, Northridge, CA (US)

(73) Assignee: Source Photonics, Inc., Chatsworth, CA (US)

( * ) Notice: Subject to any disclaimer, the term of this patent is extended or adjusted under 35 U.S.C. 154(b) by 495 days.

(21) Appl. No.: 13/323,698

(22) Filed: Dec. 12, 2011

(65) Prior Publication Data

US 2013/0094802 A1    Apr. 18, 2013

(30) Foreign Application Priority Data

Oct. 13, 2011  (CN) .......................... 2011 1 0309634
Nov. 30, 2011  (CN) .......................... 2011 1 0389727

(51) Int. Cl.
*H04B 10/00* (2013.01)
*H01S 5/042* (2006.01)

(52) U.S. Cl.
CPC ...................................... *H01S 5/042* (2013.01)

USPC ............................................................ 398/192

(58) Field of Classification Search
CPC ..................................................... H04B 10/504
USPC ..................................................... 398/182, 192
See application file for complete search history.

(56) References Cited

U.S. PATENT DOCUMENTS

2005/0196177 A1* 9/2005 Moran .......................... 398/182
2007/0116474 A1* 5/2007 Ono et al. ...................... 398/140

* cited by examiner

*Primary Examiner* — Leslie Pascal
(74) *Attorney, Agent, or Firm* — Andrew D. Fortney; Central California IP Group, P.C.

(57) ABSTRACT

The present disclosure relates to a differential drive circuit. The differential drive circuit generally includes a differential driver, a first transmission line coupled to a first output node of the differential driver, and a second transmission line coupled to a second output node of the differential driver. A laser diode is coupled to the first and second transmission lines. The first and second transmission lines have different delays, lengths, or impedances. In some embodiments, the delay between the first transmission line and the second transmission line is 0.2-0.4 times a rise time or fall time of a signal on either transmission line.

20 Claims, 4 Drawing Sheets

US 8,929,746 B2

DIFFERENTIAL DRIVER, CIRCUITS AND DEVICES INCLUDING THE SAME, AND METHOD(S) OF MANUFACTURING THE SAME

CROSS REFERENCE TO RELATED APPLICATION

This application claims the benefit of Chinese Patent Application Nos. 201110309634.1 and 201110389727.X, filed on Oct. 13, 2011 and Nov. 30, 2011, respectively, and each of which is hereby incorporated by reference as if fully set forth herein.

FIELD OF THE INVENTION

The present invention generally relates to the field of optical data communications and optical network technology (e.g., laser communications). More specifically, embodiments of the present invention pertain to a differential drive circuit for a laser diode, an optical output circuit including the laser diode, devices and transceivers including the same, and method(s) of making the same. In some embodiments, the differential drive circuit and/or optical output circuit is for 1.25 Gbs, 2.5 Gbs, 6 Gbs, or 10 Gbs optical data transmission. The present differential drive circuit advantageously provides a smooth waveform to drive the laser diode or other optical sources.

DISCUSSION OF THE BACKGROUND

Differential drive circuits and single-ended drive circuits are commonly used in drive circuits for laser diodes. In a conventional single-ended drive circuit 150, as shown in FIG. 1, a modulated current is provided to the cathode of a laser diode (LD) 120 through resistor 125, which provides a damping resistance. The anode of the LD 120 is connected to a power supply (e.g., $V_{CC}$) and a capacitor 115. Additionally, inductor 130 (comprising ferrite beads) isolates a bias output of the driver circuit 150 to provide the LD 120 with a bias. In the case of balanced DC and AC loads, the complementary output of the drive circuit 150 is increased to $V_{CC}$ by a parallel network consisting of inductor 105 and resistor 110. The resistor 110 matches the equivalent resistance of the LD 120 load and damping resistor 125. A RC parallel network (e.g., comprising resistor 135 and capacitor 140) provides high-frequency actuation and/or attenuation. The output capacitance of the driver circuit 150 (e.g., represented by capacitor 151 and capacitor 153) represents the equivalent capacitance of the transistors in drive circuit 150, the equivalent value of encapsulation, and the stray capacitance of a PCB on which the drive circuit 150 is mounted. The drive circuit 150 provides LD 120 with a modulated current (e.g., from current source 155) through a differential current switch circuit (e.g., comprising transistors 152 and 154), while a bias current generator (e.g., current source 157) provides LD 120 with a DC bias current via inductor 130.

In existing drive circuits (e.g., both single-ended and differential drive circuits), the output terminals (e.g., positive and negative) of the drive signal have the same transmission length and/or the same delay. That is, for example, the distance between the cathode/anode terminals of the LD and the cathode/anode terminals of the laser drive circuit is substantially the same for each of the terminals. For example, as shown in the timing diagram 200 of FIG. 2, the positive pulse 201 and the negative pulse 203 provided by the drive circuit 150 arrive at the load (i.e., LD 120) at the same time (e.g., at a time $t_1$). The input waveform that the load experiences is $D_P - D_N$ (i.e., waveform 201 minus waveform 203), shown as waveform 211. Waveform 211 arriving at the LD 120 has a single slope during the short rise time (e.g., from $t_1$ to $t_2$) and a single slope during the short fall time (e.g., from $t_3$ to $t_4$), resulting in high jitter and dispersion.

SUMMARY OF THE INVENTION

Embodiments of the present invention relate to an optical output circuit having a differential driver, a first transmission line coupled to a first differential output node of the differential driver and having a first delay, a second transmission line coupled to a second differential output node of the differential laser driver and having a second delay different from the first delay, and a laser diode coupled to the first transmission line and the second transmission line, and configured to receive a differential output from the differential driver. An object of the present invention is to provide an unbalanced drive circuit for solving the above-mentioned problems of high jitter and dispersion penalty. The present invention is applicable to both DC-coupled and AC-coupled configurations, as well as device interfaces utilizing various termination and matching circuits. The present differential drive circuit provides a smoother input waveform (e.g., a waveform having smoother, less abrupt amplitude increases and decreases) having low overshoot and minimal jitter and chirps. Additionally, the present differential drive circuit is capable of improving load matching, and it effectively reduces the dispersion penalty seen in conventional optical transceivers. Thus, the present invention overcomes disadvantages of conventional technology (e.g., jitter and dispersion issues associated with sharp, high-speed transitions in differential signals).

According to various embodiments of the present invention, the first delay is greater than the second delay. In alternative embodiments, the first delay is less than the second delay. In one implementation, the different delays correspond to or are a result of different lengths of the first and second transmission lines. By utilizing transmission lines having different delays, the delay between a signal on the first differential signal line and the signal on the second differential signal line may be about 0.2-0.4 times (e.g., 20-40%) the rise time (e.g., the time between times $t_1$ and $t_2$ in FIG. 1) or the fall time (e.g., the time between times $t_3$ and $t_4$ in FIG. 1) of the differential signal on either differential transmission line (e.g., the shorter differential signal line). For example, in a 1.25 Gbs optical network, the delay time between the first signal (e.g., provided on a D+ differential signal node) and the second signal (e.g., provided on a D− differential signal node) may be in the range of 60-100 ps. In a 2.5 Gbs optical network, the delay time between signal D+ and signal D− may be in the range of 30-60 ps. In a 6 Gbs optical network, the delay time between signal D+ and signal D− may be in the range of 10-20 ps.

By utilizing the present unbalanced differential data signal transmission, the waveform of the signal to the load (e.g., the LD) is smoother. That is, improving the waveform provided to the load through an unbalanced signal transmission makes the rise and fall of the waveform smoother. Instead of the rise and fall of the waveform having a single substantially linear region (e.g., a single slope), the rise and fall of the waveform on the unbalanced differential signal transmission line according to the present invention has multiple distinct regions in which the waveform is substantially linear (e.g., a plurality of slopes), resulting in a better match between the waveform and the load, lower overshoot, lower jitter, less chirps, and an effectively reduced dispersion penalty.

These and other advantages of the present invention will become readily apparent from the detailed description of various embodiments below.

DETAILED DESCRIPTION

Figure 1:
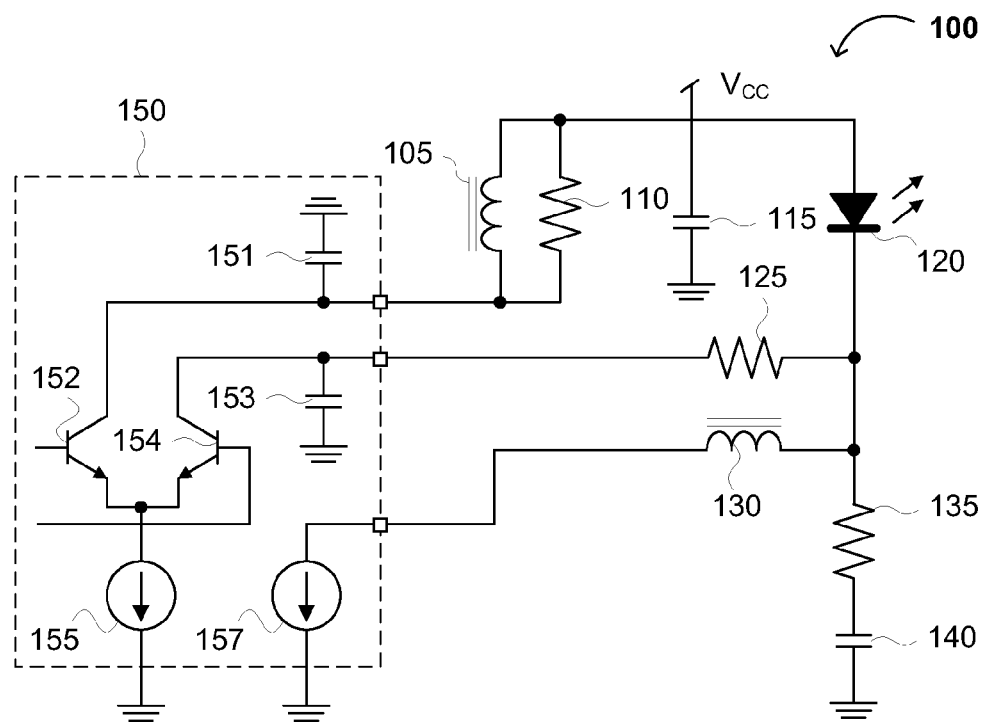
FIG. 1 is a diagram of a conventional single-ended drive circuit.

Reference will now be made in detail to various embodiments of the invention, examples of which are illustrated in the accompanying drawing(s). In order to achieve the objectives, technical solutions and advantages of the present invention more clearly, further details of the invention are described below with regard to the Figure(s). While the invention will be described in conjunction with the following embodiments, it will be understood that the descriptions are not intended to limit the invention to these embodiments. On the contrary, the invention is intended to cover alternatives, modifications and equivalents that may be included within the spirit and scope of the invention as defined by the appended claims. Furthermore, in the following detailed description, numerous specific details are set forth in order to provide a thorough understanding of the present invention. However, it will be readily apparent to one skilled in the art that the present invention may be practiced without these specific details. In other instances, well-known methods, procedures, components, and circuits have not been described in detail so as not to unnecessarily obscure aspects of the present invention. The embodiments described here are only used to explain, rather than limit, the invention.

Furthermore, all characteristics, measures or processes disclosed in this document, except characteristics and/or processes that are mutually exclusive, can be combined in any manner and in any combination possible. Any characteristic disclosed in the present specification, claims, Abstract and Figures can be replaced by other equivalent characteristics or characteristics with similar objectives, purposes and/or functions, unless specified otherwise. Each characteristic is generally only an embodiment of the invention disclosed herein.

For the sake of convenience and simplicity, the terms "connected to," "coupled to," and "in communication with" (which terms also refer to direct and/or indirect relationships between the connected, coupled and/or communicating elements, unless the context of the term's use unambiguously indicates otherwise) are generally used interchangeably herein, but are generally given their art-recognized meanings Additionally, the term "transceiver" refers to a device having at least one receiver and at least one transmitter, and use of the term "transceiver" also includes the terms "receiver" and "transmitter," unless the context clearly indicates otherwise.

The present invention concerns a differential drive circuit that can be used in high bandwidth optical networks so that data is transmitted without error. By utilizing the present differential drive circuit, an optical transmitter and/or transceiver can provide an output waveform having smoother, less abrupt amplitude increases and decreases, low overshoot, and minimal jitter and chirps to a laser diode. Thus, the present invention avoids problems associated with conventional optical transmitters and/or transceivers (e.g., dispersion, inefficient load matching, etc.), and therefore enjoys particular advantages in optical network transmitters and/or transceivers. The present invention also concerns methods for manufacturing an optical output circuit according to the present invention.

The invention, in its various aspects, will be explained in greater detail below with respect to exemplary embodiments.

Figure 3:
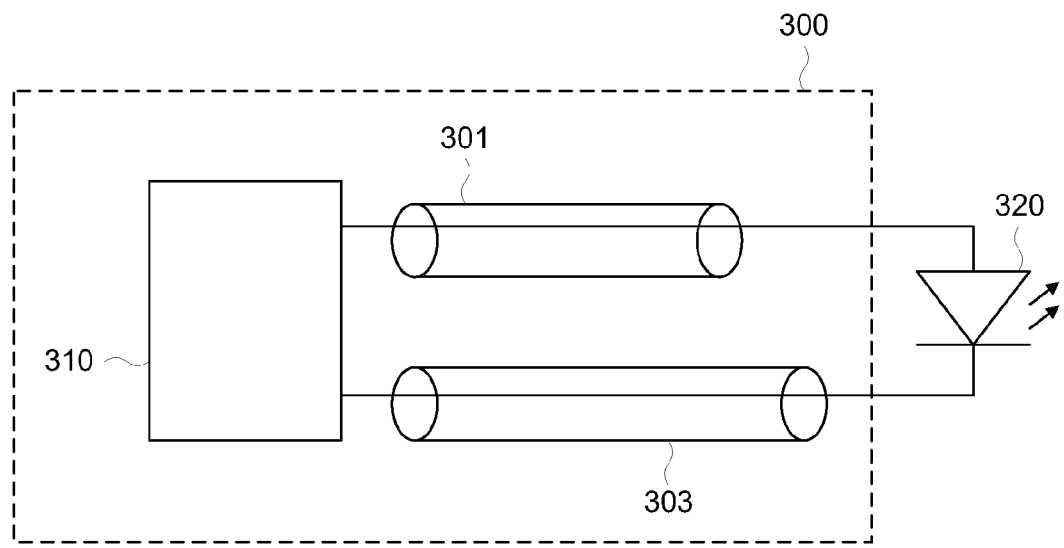
FIG. 3 is a block diagram showing an exemplary unbalanced differential drive circuit according to the present invention.

FIG. 3 shows a differential drive circuit 300 according to the present invention. As shown, differential drive circuit 300 comprises a differential driver 310, a first transmission line (e.g., a D+ transmission line) 301 connected to a first differential output node of the differential driver 310, and a second transmission line (e.g., a D− transmission line) 303 coupled to a second differential output node of the differential driver 310. Differential drive circuit 300 is coupled to a laser diode (LD) 320. More specifically, LD 320 is coupled to first transmission line 301 and second transmission line 303, and is configured to receive a differential output from differential driver 310. In some embodiments, first transmission line 301 is coupled to the cathode input of LD 320, and the second transmission line 303 is coupled to the anode input of LD 320.

As shown, the first transmission line 301 has a delay (e.g., a length) smaller than that of the second transmission line 303. However, in some embodiments, first transmission line 301 has a delay (or length) greater than that of second transmission line 303. The different delays or lengths of the first and second transmission lines 301 and 303 create a timing imbalance between the positive (+) and negative (−) transmission lines of the differential signal provided to the laser diode 320. As an alternative to the difference in length, the timing imbalance or delay can be a result of a difference in impedance, resistance (discussed below in greater detail with respect to FIG. 5), capacitance and/or inductance between the two transmission lines. For example, the second transmission line 303 may have an impedance, capacitance and/or inductance greater than that of the first transmission line 301, resulting in a time delay or imbalance in comparison to the first transmission line 301. If the timing imbalance or delay is a result of a difference in impedance between the two transmission lines, the difference may also be a result of different lengths and/or widths of the transmission lines. When the first (e.g., a positive or D+) transmission line 301 is shorter than the second (e.g., a D− or negative) transmission line 303, a signal provided to the LD 320 by the second transmission line 303 arrives later than that provided by the first transmission line 301. Such a time delay is explained in greater detail below with respect to FIG. 4.

Figure 4:
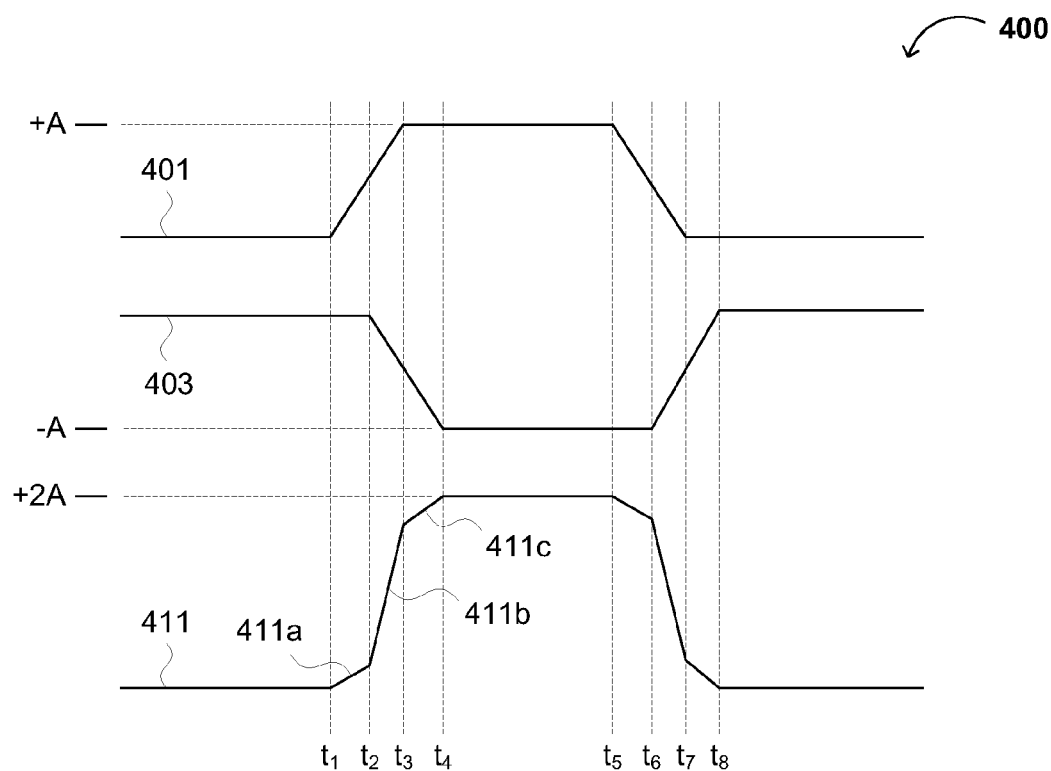
FIG. 4 is a graph illustrating an exemplary output waveform of the differential drive circuit of FIG. 3.

Graph 400 of FIG. 4 shows a first signal 401 having an amplitude +A and a second signal 403 having a second amplitude −A. Together, first and second signals 401 and 403 form a differential signal, which can be provided to the load (e.g., laser diode 320) via the first (e.g., D+) transmission line 301 and the second (e.g., D−) transmission line 303 in FIG. 3. In one embodiment, the first transmission line 301 is shorter than the second transmission line 303. As shown in FIG. 4, a time delay equal to a difference $t_2-t_1$ is introduced between the first and second signals 401 and 403. That is, referring to FIG. 3, LD 320 receives first signal 401 on the first transmission line 301 a period of time $t_2-t_1$ before second signal 403 on the second transmission line 303.

FIG. 4 also shows a third signal 411, which is equal to the absolute value of the amplitude of waveform 401 (e.g., +A) minus the amplitude of waveform 403 (e.g., −A), |(+A)−(−A)|, or +2 A. As shown, third signal 411 provides relatively gradual increases and decreases in amplitude during transitions of the differential signal. That is, there are multiple substantially linear regions during the periods in which the third signal 411 increases and decreases, as opposed to conventional drivers which have a single substantially linear region during each of the rise and fall times.

For example, during the time period between time $t_1$ and time $t_2$, the amplitude of the third signal 411 increases relatively slowly. However, during the time period between time $t_2$ and time $t_3$, the amplitude of the third signal 411 increases at a rate faster than that of the previous time period (e.g., between times $t_1$ and $t_2$). As shown in graph 400, third signal 411 has a relatively steeper slope between time $t_2$ and time $t_3$. At time $t_3$, the amplitude increases at a slower rate than that of the time period between $t_2$ and $t_3$. At time $t_4$, when the amplitude of signal 401 is equal to the absolute value of the amplitude of signal 403, the third signal 411 levels off and does not increase or decrease until a time $t_5$. Thus, during the time period between times $t_1$ and $t_4$, the amplitude of third signal 411 increases at different rates, in effect providing third signal 411 with a plurality of substantially linear regions 411a, 411b, and 411c. Similar results can be seen for decreases in the amplitude of third signal 411 (e.g., between times $t_5$ and $t_8$). Thus, the third signal 411 received at LD 320 has smoother amplitude swings (e.g., increases and decreases) than output signals provided by conventional drivers that more closely resemble a square-wave.

Improving the waveform of third signal 411 through unbalanced transmission (e.g., via transmissions lines of differing delays) makes the increases and decreases in amplitude smoother than conventional drivers utilizing a single substantially linear region during rise and fall times. The smoother waveform provided by the present unbalanced signal transmission improves the load matching, reduces overshoot, reduces jitter and chirps, and effectively reduces or eliminates the dispersion penalty seen in conventional drivers.

When a first signal transmission line (e.g., a D+ transmission line or transmission line 301 in FIG. 3) has a delay (or length, width, impedance, capacitance, inductance, and/or resistance) greater than that of a second signal transmission line (e.g., a D− transmission line or transmission line 303 in FIG. 3), a first signal (e.g., a $D_P$ signal or signal 401 in FIG. 4) on the first signal transmission line 301 arrives with a time delay with respect to a second signal (e.g., a $D_N$ signal or signal 403 in FIG. 4) on the second signal transmission line 303. Thus, the waveforms of the first and second signals will be similar to third signal 411 in FIG. 4. That is, as a result of the transmission lines having different delays, the rise and fall of the third signal 411 of the load becomes smoother, and has less jitter than differential signals provided by conventional drivers.

When a time delay between first and second transmission lines is due to a difference in transmission line lengths, the time delay (T) can be calculated according to the equation $T=(D_P-D_N)/v$, where $D_P$ is the length of the first transmission line (e.g., a D+ transmission line or first transmission line 301 in FIG. 3), $D_N$ is the length of the second transmission line (e.g., a D− transmission line or second transmission line 303 in FIG. 3), and v is the transmission or operating speed of the differential signal on the first and second transmission lines. Thus, by knowing the operating speed of the signal and the time delay, the difference in length between the first and second transmission lines can be set. Similar relationships exist between the respective impedances, capacitances and/or inductances of the transmission lines and the time delay between the positive and negative transmission lines.

Figure 2:
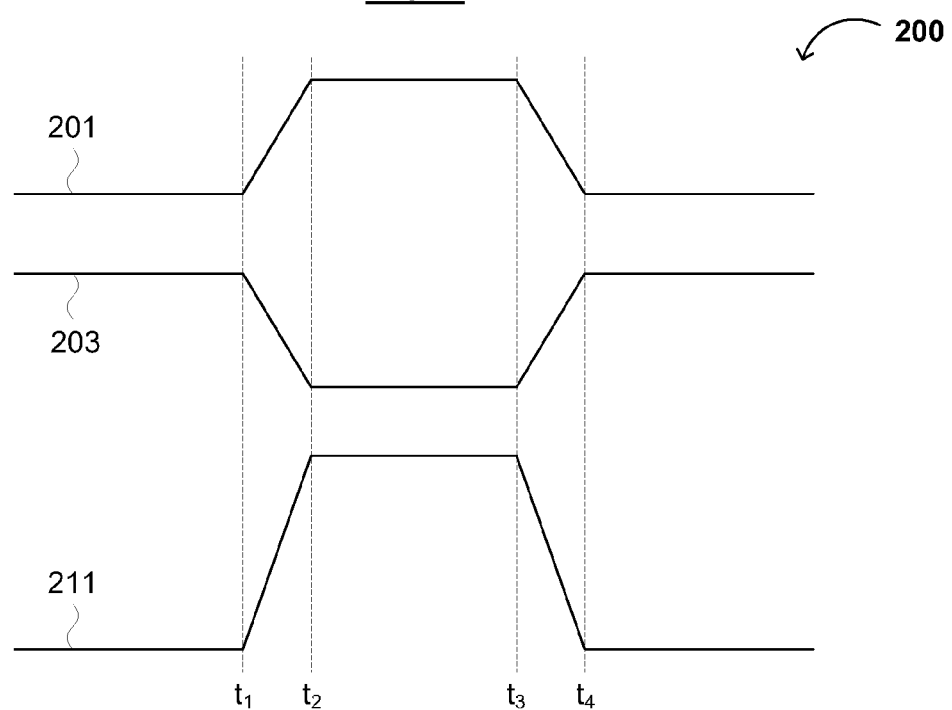
FIG. 2 is a graph illustrating an output waveform of the drive circuit of FIG. 1.

If the duration of the time delay D between $D_P$ and $D_N$ (e.g., the time period between time $t_1$ and time $t_2$ of FIG. 4) is too small, the time delay D does not result in a significantly smoother waveform. Similarly, if the time delay D is too long, the time delay may make the rise (i.e., the time period between time $t_1$ and time $t_4$) and fall (i.e., the time period between time $t_5$ and time $t_8$) of the signal too smooth (e.g., too similar to a triangular or sinusoidal waveform). Experiments and simulations indicate that the time delay is most effective when it has a value between 0.2-0.4 times the rise or fall time (e.g., in FIG. 2, the time period between times $t_1$ and $t_2$, or times $t_3$ and $t_4$, or in FIG. 4, between the times $t_1$ and $t_3$, $t_2$ and $t_4$, $t_5$ and $t_7$, or $t_6$ and $t_8$). For example, in the case of a rise time (or fall time) of approximately 150 ps, the time delay according to the present invention should be in the range of 30-60 ps, such that a relatively smooth waveform having an excellent eye pattern is seen at the load. Generally, when 1.25 Gbs transmission equipment such as optical transceivers and/or transmitters is used, a time delay between a signal on the first transmission line (e.g., a D+ signal) and a signal on the second transmission line (e.g., a D− signal) should be in the range of 60-100 ps. Additionally, when 2.5 Gbs transmission equipment is used, a time delay between a signal on the first transmission line (e.g., a D+ signal) and a signal on the second transmission line (e.g., a D− signal) should be in the range of 30-60 ps. Furthermore, when 6 Gbs transmission equipment is used, a time delay between a signal on the first transmission line (e.g., a D+ signal) and a signal on the second transmission line (e.g., a D− signal) should be in the range of 10-20 ps.

The first and second transmission lines according to the present invention can be manufactured using strip-lines and/or micro-strip lines. Strip-lines and micro-strip lines are a known, mature technology in this field.

An Exemplary DC-Coupled Unbalanced Differential Drive Circuit

Figure 5A:
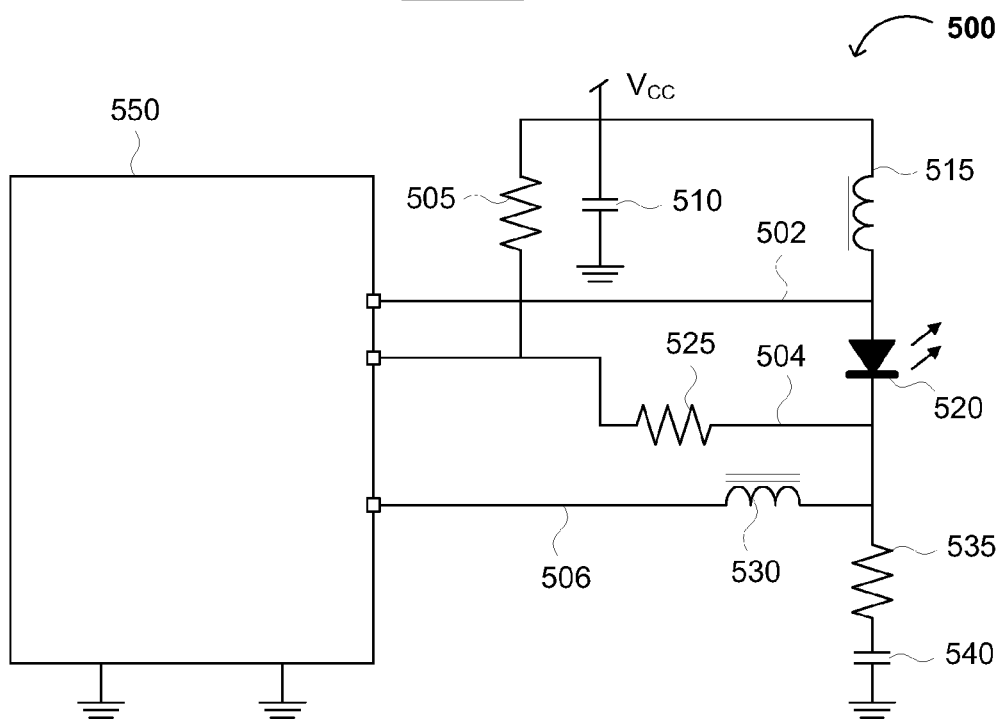
FIG. 5A is an exemplary DC-coupled embodiment of the present unbalanced differential drive circuit of FIG. 3.

FIG. 5A shows an exemplary DC-coupled differential drive circuit 500 according to the present invention. Laser driver 550 may comprise circuitry (e.g., a modulated current source, a differential current switch circuit, a bias current generator, etc.) similar to that of drive circuit 150 in FIG. 1. As shown, a modulated current is provided from laser driver 550 to the cathode of a laser diode (LD) 520 through resistor 525. Resistor 525 provides a damping resistance on transmission line 504 (e.g., a negative, complementary, or second differential transmission line), and resistor 505 provides a back termination for the transmission line 504, so that if any signal on the transmission line 504 is reflected back from the laser 520, it will be absorbed by the resistor 505. The anode terminal of the LD 520 is connected to a first terminal of inductor 515 and to transmission line 502 (e.g., a positive, true, or first differential transmission line). The opposite or cathode terminal of inductor 515 is coupled to an optional resistor 505 and a capacitor 510, all of which may be coupled to a power supply (e.g., $V_{CC}$). In some embodiments, resistor 505 has a resistance equivalent to that of damping resistor 525 on second transmission line 504. In alternative embodiments, the resistance of resistor 505 may be greater than or equal to the resistance of resistor 525 times a factor z, where z≥1.1, 1.2, 1.25, 1.3, 1.4, or 1.5, up to about 2, 3, 4, 5, or more. Alternatively, z≤0.9, 0.8, 0.75, 0.7, or 0.65, down to about 0.5, 0.4, 0.3, 0.25, 0.2, or less. In some embodiments, a further back termination resistor (not shown) may be coupled between transmission line 502 and Vcc to absorb any signal (e.g., current or voltage) on transmission line 502 reflected from LD 520. In an alternative embodiment, the back termination resistors are integrated into the laser driver 550, in which case there is no need for external resistors. In general, the values of resistor 525, capacitor 510 and inductor 515 are configured and/or selected such that a differential delay and a differential voltage are received at the terminals of LD 520 as described herein.

Inductor 530 (which may comprise ferrite beads) isolates a bias output of the laser driver 550 and provides a bias at the cathode terminal of LD 520. The bias output is provided on transmission line 506, and can be provided by a bias current generator (e.g., similar to current source 157 in FIG. 1). An optional RC parallel network (e.g., comprising resistor 535 and capacitor 540) provides high-frequency actuation and/or attenuation (e.g., actuation and/or attenuation of a differential voltage at the cathode terminal of LD 520). Additionally, driver circuit 550 provides LD 520 with a modulated current (e.g., from an internal current source) through a differential current switch circuit (e.g., similar to the differential current switch circuit comprising transistors 152 and 154 in FIG. 1).

The complementary (e.g., positive and negative) differential transmission lines 502 and 504 are unbalanced. That is, differential transmission lines 502 and 504 are similar to transmission lines 301 and 303 (discussed above with respect to FIG. 3) and have different transmission delays (e.g., lengths). Thus, depending on the length, width, impedance, etc. introduced on each of the individual transmission lines (e.g., the resistance provided by resistor 525 on transmission line 504), the first transmission line 502 may have a delay smaller than that of the second transmission line 504. In alternative embodiments, the first transmission line 502 has a delay greater than that of second transmission line 504.

As a result, a waveform provided at the terminals of LD 520 using unbalanced transmission lines 502 and 504 (e.g., via transmission lines of differing delays) makes the increases and decreases in amplitude smoother than conventional drivers that have a waveform with a single substantially linear region during rise and fall times. The smoother waveform (e.g., as shown in FIG. 4) provided by the present unbalanced signal transmission improves the load matching, reduces overshoot, reduces jitter and chirps, and effectively reduces or eliminates the dispersion penalty seen in conventional drivers.

An Exemplary AC-Coupled Unbalanced Differential Drive Circuit

Figure 5B:
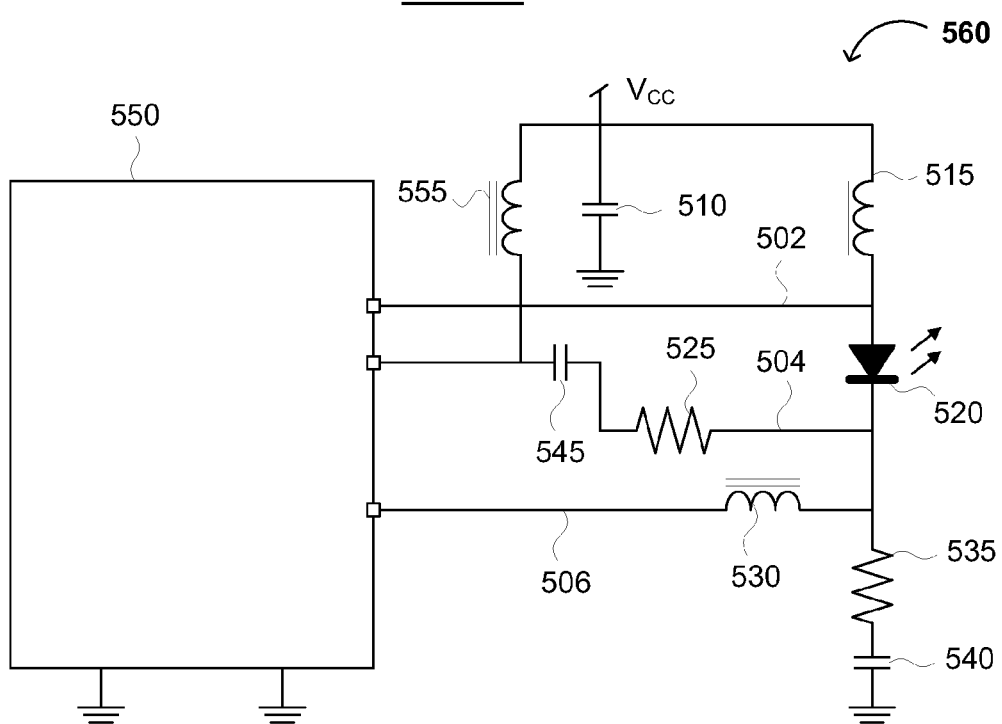
FIG. 5B is a first exemplary AC-coupled embodiment of the present unbalanced differential drive circuit.

FIG. 5B shows an exemplary AC-coupled differential drive circuit 560 according to the present invention. As shown, unbalanced differential drive circuit 560 comprises circuitry similar to that of unbalanced differential drive circuit 500 of FIG. 3, and those structures having the same identification numbers discussed below with respect to FIG. 5B may be substantially the same as those discussed above with respect to FIG. 5A.

As shown, a modulated current is provided from laser driver 550 to the cathode of a laser diode (LD) 520 through capacitor 545 and resistor 525. Resistor 525 provides a damping resistance on transmission line 504 (e.g., a negative, complementary, or second differential transmission line). The anode terminal of the LD 520 is connected to a first terminal of inductor 515 and to transmission line 502 (e.g., a positive, true, or first differential transmission line). The opposite terminal of inductor 515 is coupled to inductor 555 and capacitor 510, all of which may be coupled to a power supply (e.g., $V_{CC}$). In general, the values of inductors 515 and 555, capacitors 510 and 545, and resistor 525 are configured and/or selected such that a differential delay and a differential voltage is received at the terminals of LD 520 as described herein. In some embodiments, capacitor 545 has an impedance equivalent to that of capacitor 510.

Figure 5C:
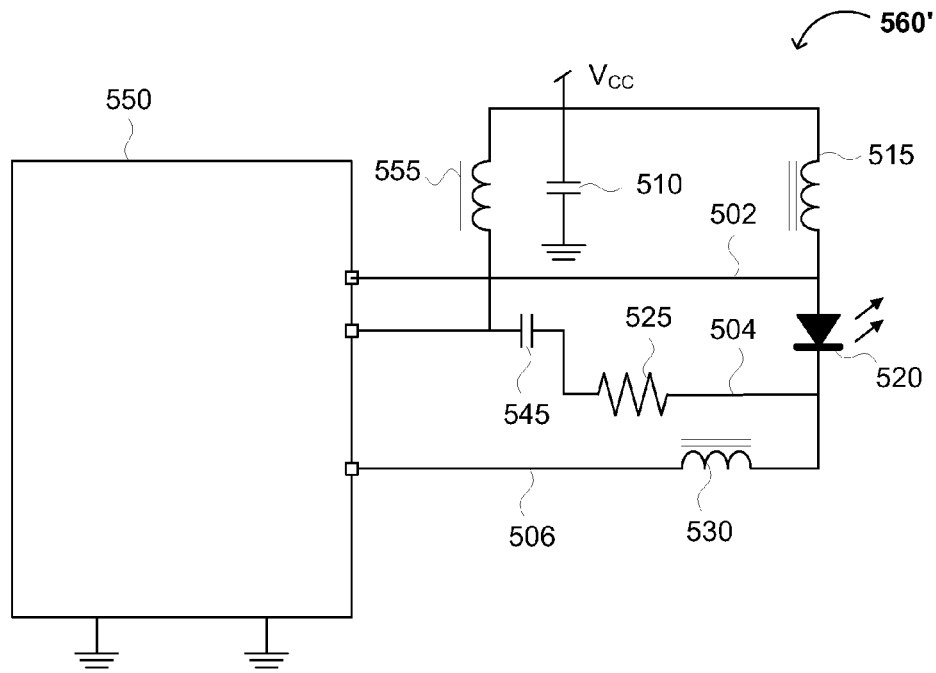
FIG. 5C is a second exemplary AC-coupled embodiment of the present unbalanced differential drive circuit.

Inductor 530 isolates a bias output of the laser driver 550 and provides a bias at the cathode terminal of LD 520. The bias output is provided on transmission line 506, and can be provided by a bias current generator (e.g., similar to current source 157 in FIG. 1). An RC parallel network comprising resistor 535 and capacitor 540 and providing high-frequency actuation and/or attenuation (e.g., actuation and/or attenuation of a differential voltage at the cathode terminal of LD 520) is optional. FIG. 5C shows an embodiment of AC-coupled differential drive circuit 560' without the RC parallel network. Driver circuit 550 provides LD 520 with a modulated current (e.g., from an internal current source) through a differential current switch circuit (e.g., similar to the differential current switch circuit comprising transistors 152 and 154 in FIG. 1).

As discussed above with respect to FIG. 5A, complementary (e.g., positive and negative) differential transmission lines 502 and 504 are unbalanced and have different transmission delays (e.g., lengths). Thus, depending on the length, width, impedance, etc. introduced on each of the individual transmission lines (e.g., the resistance provided by resistor 525 on transmission line 504), the first transmission line 502 may have a delay smaller than that of the second transmission line 504.

As a result, a waveform provided at the terminals of LD 520 using unbalanced transmission lines 502 and 504 (e.g., via transmission lines of differing delays) makes the increases and decreases in amplitude smoother than conventional drivers (e.g., as shown in FIG. 1) that have a waveform with a single substantially linear region during rise and fall times. The smoother waveform (e.g., as shown in FIG. 4) provided by the present unbalanced signal transmission improves the load matching, reduces overshoot, reduces jitter and chirps, and effectively reduces or eliminates the dispersion penalty seen in conventional drivers.

An Exemplary Transceiver Comprising an Unbalanced Differential Driver Circuit

Figure 6:
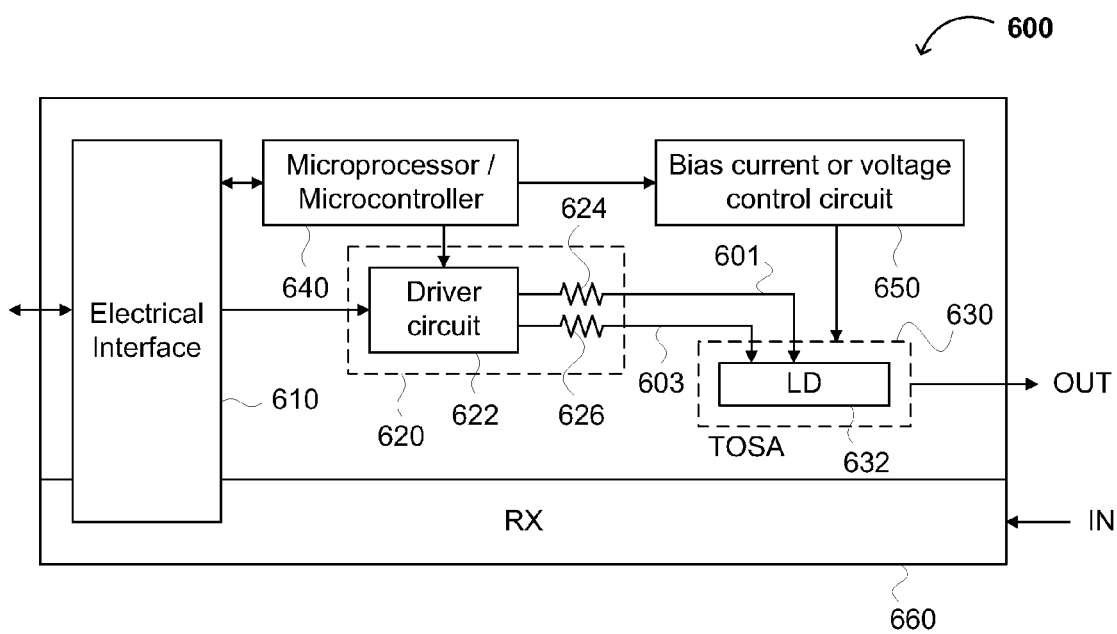
FIG. 6 is a diagram showing an exemplary optical and/or optoelectronic transceiver according to the present invention.

FIG. 6 illustrates an exemplary embodiment of a transceiver (e.g., a SFP+ transceiver) 600 comprising an electrical interface 610, unbalanced differential driver circuit 620, transmitter optical subassembly (TOSA) 630, microprocessor/microcontroller 640, a bias current or voltage control circuit 650, and a receiver portion 660. Electrical interface 610 can be any interface capable of accurately and/or effectively transferring data and/or signals between an external host (not shown) and components of the transceiver 600 (e.g., microprocessor/microcontroller 640, unbalanced differential driver circuit 620, receiver 660, etc.).

Unbalanced differential driver circuit 620 comprises a differential driver circuit 622, a first transmission line 601 comprising a first resistor (e.g., $R_1$) 624, and a second transmission line 603 comprising a second resistor (e.g., $R_2$) 626. First resistor 624 and second resistor 626 are each serially connected between differential driver circuit 622 and TOSA 630 on their respective transmission line. In some embodiments, $R_1$ has a resistance value greater than that of $R_2$. In other embodiments, $R_1$ has a resistance value less than that of $R_2$. For example, the resistance of second resistor 626 $R_2$ may be greater than or equal to the resistance of first resistor 624 $R_1$ times a factor z, where z≥1.1, 1.2, 1.25, 1.3, 1.4, or 1.5, up to about 2, 3, 4, 5, or more; alternatively, z≤0.9, 0.8, 0.75, 0.7, or 0.65, down to about 0.5, 0.4, 0.3, 0.25, 0.2, or less. Differential driver circuit 620 can be AC-coupled or DC-coupled.

In some embodiments, the resistance values of resistors 624 and 626 are equal. In such embodiments, a difference in impedance, capacitance, and/or inductance between the two transmission lines may be present. For example, the first transmission line may have a capacitance greater than that of the second transmission line, resulting in a time delay or imbalance in comparison to the second transmission line. In alternative embodiments, the second transmission line may have a capacitance greater than that of the first transmission line, resulting in a time delay or imbalance in comparison to the first transmission line. Similar to FIG. 5A, anti-reflection resistors may be coupled to laser diode 632 (not shown). Alternatively, driver circuit 622 may comprise internal anti-reflection resistors (not shown).

TOSA 630 comprises a laser diode (e.g., a distributed feedback [DFB] laser diode) 632, and optionally, a modulator (not shown) configured to adjust a driving voltage or current provided to laser diode 632. Generally, laser diode 632 is directly modulated. Microprocessor or microcontroller 640 can be a microprocessor, microcontroller, FPGA, ASIC, or CPLD configured to control and/or adjust various functions of optical transceiver 600. Bias current or voltage control circuit 650, in various embodiments (not shown), may comprise a DC/DC converter, a filter network, and a digital-to-analog converter (DAC) at an input to the DC/DC converter. In some embodiments (not shown), receiver portion 660 comprises a receiver optical sub assembly (ROSA) configured to receive an optical input signal (e.g., optical input signal IN received from an optical signal medium such as a fiber optic cable) and provide an electrical output signal (e.g., via a limiting amplifier and/or a transimpedance amplifier) to electrical interface 610.

As shown in FIG. 6, electrical interface 610 is coupled to microprocessor (or microcontroller unit) 640 via one or more buses, and provides one or more signals (e.g., from an electrical component in communication with transceiver 600) to receiver portion 660, microprocessor 640, and unbalanced differential driver circuit 620. Microprocessor/MCU 640 is configured to control and/or regulate various functions of the transceiver modules (e.g., receiver portion 660, unbalanced differential driver circuit 620, bias current or voltage control circuit 650, etc.). For example, microprocessor/MCU 640 is configured to maintain a desired or predetermined optical output power (e.g., optical output signal OUT provided by laser diode 632) by controlling the bias current or voltage provided by bias current or voltage control circuit 650 to the laser diode 632. Bias current or voltage adjustments can be controlled via one or more control signals provided from microprocessor 640 to bias current or voltage circuit 650.

As shown, unbalanced differential driver circuit 620, comprising differential laser diver 622 and first and second unbalanced transmission lines 601 and 603, is connected between electrical interface 610 and TOSA 630, and may be configured to receive a control signal from microprocessor 640 (e.g., a control signal configured to enable or activate a differential output signal across first and second transmission lines 601 and 603). Unbalanced differential driver circuit 620 utilizes first transmission line 601 and second transmission line 603 to provide a differential output signal to laser diode 632. First transmission line 601 may have a delay greater than that of second transmission line 603, resulting in a time delay between a differential signal on the first and second transmission lines 601 and 603, respectively.

Thus, unbalanced differential driver circuit 620 can provide an output waveform having smoother, less abrupt amplitude increases and decreases, low overshoot, and minimal jitter and chirps to the load (e.g., laser diode 632) in an optical transceiver. Furthermore, the present transceiver 600 avoids problems associated with conventional optical transmitters and/or transceivers (e.g., dispersion, inefficient load matching, etc.), and therefore enjoys particular advantages in optical network equipment.

An Exemplary Method of Manufacturing a Differential Drive Circuit

The present invention also comprises a method for manufacturing an optical output circuit. Specifically, the method comprises coupling a first transmission line (e.g., first transmission line 301 of FIG. 3) having a first delay to a first differential node of a differential driver (e.g., differential driver 310 of FIG. 3). In some embodiments, the first transmission line comprises a strip-line or a micro-strip line. Alternatively, the method comprises coupling a first capacitor, inductor, and/or resistor to the first transmission line. For example, the method may comprise coupling an impedance source (e.g., a capacitor, resistor and/or inductor, such as a first RC, LC, or RLC circuit) to the first transmission line. Such components can be added to the first transmission line to accurately and effectively create the first delay.

Additionally, the method comprises coupling a second transmission line (e.g., second transmission line 303 of FIG. 3) having a second delay different from the first delay to a second differential node of the differential driver. In some embodiments, the second differential node is a negative (−) or complementary node, and the first differential node is a positive (+) or true node. In such embodiments, the second differential node sinks an output current and the first differential node sources the output current. In alternative embodiments, the first differential node is a negative (−) or complementary node, and the second differential node is a positive (+) or true node. In such embodiments, the first differential node sinks an output current, and the second differential node sources the output current. In some embodiments, the second transmission line comprises a strip-line or a micro-strip line.

Alternatively, the method comprises coupling a second impedance source (e.g., a capacitor, inductor, and/or resistor) to the second transmission line. The second capacitor, inductor, and/or resistor have a value (e.g., a capacitance, inductance, and/or resistance value) different from that of the first capacitor, inductor, and/or resistor. For example, the method may comprise coupling a capacitor, resistor and/or inductor (e.g., a second RC, LC, or RLC circuit) to the second transmission line. Such components can be added to the second transmission line to accurately and effectively create the second delay.

Furthermore, in some embodiments, the first delay is less than the second delay. In alternative embodiments, the second delay is less than the first delay. By utilizing transmission lines having different delays, a time delay is introduced between the transmission lines such that an output signal of the differential driver provided to a load (e.g., LD 320 of FIG. 3) has a smoother waveform compared to those of conventional differential drivers. For example, in various embodiments, the time delay between a signal on the first and second transmission lines may be about 10-20 ps, 30-60 ps, or 60-100 ps. Such time delays can be used for optical network circuitry having an operating speed of 6 Gbs, 2.5 Gbs, and 1.25 Gbs, respectively. Optical network circuitry operating at 10 Gbs can also be utilized with an appropriate corresponding time delay (e.g., 2-4 ps).

The method further comprises coupling a first input of a laser diode (e.g., laser diode 320 of FIG. 3) to the first transmission line and a second input of the laser diode to the second transmission line. In some embodiments, the first input of the laser diode is a cathode terminal and the second input of the laser diode is an anode terminal. In alternative embodiments, the first input of the laser diode is an anode terminal and the second input of the laser diode is a cathode terminal.

By utilizing the present method, a differential drive circuit providing an output signal having a smooth waveform, less abrupt amplitude increases and decreases, low overshoot, and minimal jitter and chirps can be provided to an optical output circuit (e.g., in an optical and/or optoelectronic transceiver). Thus, the present optical output circuit avoids problems associated with conventional differential drivers (e.g., dispersion, inefficient load matching, etc.), and therefore enjoys particular advantages in optical network equipment.

Conclusion/Summary

Thus, the present invention provides a differential drive circuit and methods of manufacturing the same. The present differential drive circuit advantageously provides a signal having a smoother waveform with less abrupt amplitude increases and decreases, low overshoot, and minimal jitter and chirps. The present invention reduces problems associated with conventional optical transmitters and/or transceivers (e.g., dispersion penalty, inefficient signal-load matches, etc.), and therefore enjoys particular advantages in optical network transmitters and/or transceivers. The present invention also concerns methods for manufacturing a differential drive circuit according to the present invention.

The present invention is not restricted to the above-mentioned embodiments. The present invention expands to any new features or any new combination thereof, and any procedure, new method or procedure, or any new combination thereof described in the present specification. That is, the foregoing descriptions of specific embodiments of the present invention have been presented for purposes of illustration and description. They are not intended to be exhaustive or to limit the invention to the precise forms disclosed, and many modifications and variations are possible in light of the above teachings. The embodiments were chosen and described in order to best explain the principles of the invention and its practical application(s), to thereby enable others skilled in the art to best utilize the invention and various embodiments with various modifications as are suited to the particular use(s) contemplated. It is intended that the scope of the invention be defined by the claims appended hereto and their equivalents.

What is claimed is:

1. An optical output circuit, comprising:
   a differential driver;
   a first transmission line coupled to a first differential output node of said differential driver and having a first delay;
   a second transmission line coupled to a second differential output node of said differential laser driver and having a second delay different from said first transmission line, wherein a difference between said first delay and said second delay is 0.2-0.4 times the rise time or fall time of a signal on either of said first transmission line or said second transmission line; and
   a laser diode coupled to said first transmission line and said second transmission line, and configured to receive a differential output from said differential driver.

2. The optical output circuit of claim 1, wherein said first delay is less than said second delay.

3. The optical output circuit of claim 1, wherein said second delay is less than said first delay.

4. The optical output circuit of claim 1, further comprising a capacitor, inductor, and/or resistor coupled to at least one of said first or second transmission lines.

5. The optical output circuit of claim 1, wherein said difference between said first delay and said second delay is about 60-100 ps.

6. The optical output circuit of claim 1, wherein said difference between said first delay and said second delay is about 30-60 ps.

7. The optical output circuit of claim 1, wherein said difference between said first delay and said second delay is about 10-20 ps.

8. The optical output circuit of claim 1, wherein each of said first and second transmission lines comprises a strip-line or a micro-strip line.

9. The optical output circuit of claim 8, wherein a difference between said first delay and said second delay is implemented by a difference in lengths of said strip-line or micro-strip line.

10. The optical output circuit of claim 1, wherein said differential driver sinks an output current from or sources an output current to each of said first and second transmission lines.

11. The optical output circuit of claim 1, wherein a cathode input of said laser diode is coupled to said second transmission line, and an anode input of said laser diode is coupled to said first transmission line.

12. A method of manufacturing an optical output circuit, comprising:
    coupling a first transmission line to a first differential node of a differential driver, said first transmission line having a first delay;
    coupling a second transmission line to a second differential node of said differential driver, said second transmission line having a second delay different from said first delay, and a difference between said first delay and said second delay is 0.2-0.4 times the rise time or fall time of a signal on either of said first transmission line or said second transmission line; and
    coupling a first input of a laser diode to said first transmission line and a second input of said laser diode to said second transmission line.

13. The method of claim 12, wherein said first delay is less than said second delay.

14. The method of claim 12, wherein said second delay is less than said first delay.

15. The method of claim 12, wherein said difference between said first delay and said second delay is about 10-20 ps.

16. The method of claim 12, wherein said difference between said first delay and said second delay is about 30-60 ps.

17. The method of claim 12, wherein said difference between said first delay and said second delay is about 60-100 ps.

18. The method of claim 12, wherein each of said first and said second transmission lines comprises a strip-line or a micro-strip line.

19. The method of claim 18, comprising implementing the difference between said first delay and said second delay by varying a difference in lengths of said strip-line or micro-strip line of said first and said second transmission lines.

20. The method of claim 12, wherein said first input of said laser diode is a cathode input, and said second input of said laser diode is an anode input.

* * * * *